United States Patent
Kishi

(10) Patent No.: US 6,445,327 B1
(45) Date of Patent: Sep. 3, 2002

(54) SIGNAL ANALYZING APPARATUS

(75) Inventor: Yuji Kishi, Sagamihara (JP)

(73) Assignee: Anritsu Corporation, Tokyo (JP)

( * ) Notice: Subject to any disclaimer, the term of this patent is extended or adjusted under 35 U.S.C. 154(b) by 0 days.

(21) Appl. No.: 09/704,157

(22) Filed: Nov. 1, 2000

(30) Foreign Application Priority Data

Nov. 11, 1999 (JP) .......................................... 11-320453

(51) Int. Cl.[7] .............................................. H03M 1/12
(52) U.S. Cl. ....................................... 341/155; 395/140
(58) Field of Search ................................. 341/155, 156, 341/157, 162, 161, 131, 116, 143, 114, 115, 111, 112; 324/76.27; 395/140

(56) References Cited

U.S. PATENT DOCUMENTS

| | | | |
|---|---|---|---|
| 5,434,954 A | * | 7/1995 | Kawauchi et al. ........... 395/140 |
| 5,519,820 A | * | 5/1996 | Kawauchi et al. ........... 395/140 |
| 5,579,463 A | * | 11/1996 | Takano et al. ............... 395/140 |
| 5,617,523 A | * | 4/1997 | Imazy et al. ................. 395/140 |
| 5,869,959 A | * | 2/1999 | Tomikawa ............... 324/76.27 |

* cited by examiner

Primary Examiner—Brian Young
Assistant Examiner—John B Nguyen
(74) Attorney, Agent, or Firm—Frishauf, Holtz, Goodman & Chick, P.C.

(57) ABSTRACT

A frequency conversion unit converts the frequencies of input signals into intermediate frequencies using a predetermined local oscillation frequency. A sweeping unit sweeps the local oscillation frequencies in a predetermined sweeping time. A filter selectively passes signals having frequency components of a predetermined bandwidth based on signals sent from the frequency conversion unit. An A/D converter samples signals that have passed the filter and converts them into predetermined digital data. A signal processing unit processes signals, extending the digital data saved in the data storage unit into frequency spectrum data. A correction data storage unit saves the correction data of the delay times for the bandwidth in the filter. Based on the correction data saved in the correction data storage unit, a control unit changes the timing at which data is sent from the A/D converter to the signal processing unit via the data storage unit, so that a measured frequency corresponding to the local oscillation frequency upon the start of sweep in the sweeping unit may be correlated with the data that corresponds to the measured frequency and has been saved in the storage unit, in a one-to-one relationship. An output unit provides frequency spectrum data that has been processed in the signal processing unit.

11 Claims, 4 Drawing Sheets

| RBW | DELAY |
|---|---|
| 30kHz | 37.1 μs |
| 10kHz | 79.0 μs |
| 3kHz | 274 μs |
| 1kHz | 1230 μs |
| 300Hz | 2080 μs |

SIGNAL ANALYZING APPARATUS

CROSS-REFERENCE TO RELATED APPLICATIONS

This application is based upon claims the benefit of priority from the prior Japanese Patent Application No. 11-320453 filed Nov. 11, 1999, the entire contents of which are incorporated herein by reference.

BACKGROUND OF THE INVENTION

The present invention relates to a signal analyzing apparatus and, more particularly, to a signal analyzing apparatus that measures the frequency characteristics of signals used in mobile communication systems such as mobile telephones and cellular telephones and displays their waveforms.

For example, signals employed in mobile communication systems such as mobile telephones and cellular telephones are modulated by a number of modulation methods.

These mobile communication systems adopt TDMA (Time Division Multiple Access) as a communication method for using communication circuits efficiently.

The frequencies of carrier waves conveying signals used in those mobile communication systems are very high, ranging from several hundred MHz to several GHz.

Signal analyzing apparatuses such as spectrum analyzers are used to precisely measure various frequency components included in those signals.

FIG. 3 is a block diagram that illustrates a schematic configuration of the prior-art signal analyzing apparatus that measures the frequency characteristics of such signals of high frequencies.

In such a conventional signal analyzing apparatus 51 of FIG. 3, signal "a" of a high frequency that is entered through an input terminal 52 for decoding is controlled to have a predetermined level of intensity with an attenuator (ATT) 53 and then provided to a frequency conversion unit 54.

The signal of a high frequency entered to the frequency conversion unit 54 for decoding is mixed in a signal mixer 55 with a local oscillation signal "b" transmitted from a local oscillator 56 and then converted to a signal of an intermediate frequency.

The signal of an intermediate frequency is narrowed in bandwidth with a BPF (Band Pass Filter) 57 and again mixed with the local oscillation signal transmitted from the local oscillator 59 in another signal mixer 58 in the subsequent part and sent out from the frequency conversion unit 54.

The frequency provided by the local oscillator 56 in the frequency conversion unit 54 is swept over a predetermined frequency range by a sweep control unit 60.

As a result, the frequency of the intermediate-frequency signal "c" sent out from the frequency conversion unit 54 changes in synchronization with the sweeping operation.

The intermediate-frequency signal "c" of which frequency was reduced and sent out from the frequency conversion unit 54 is entered to a Resolution BAND Width (RBW) filter 61.

This RBW filter 61 is comprised of an analog band pass filter having frequency characteristics shown in FIG. 4, for example, and only selects necessary signals of intermediate frequencies with unnecessary frequency components being removed.

The bandwidth (RBW) 3 dB lower than the peak level of the central passing frequency fc in the frequency characteristics of the band pass filter represents the frequency resolution of this signal analyzing apparatus 51.

Frequency f1 of the intermediate-frequency signal "c" sent from the frequency conversion unit 54 changes in synchronization with the sweeping operation.

Therefore, the output signal sent out from the RBW filter 61 during a one sweeping period (sweeping interval) present the time-series waveform of each frequency component in the measurement signal "a" that has been converted to the intermediate-frequency signal "c".

This output signal from the RBW filter 61 is log-converted by a logarithmic (LOG) converter 62 after a gain adjustment in an amplifier (not shown).

The output signal, of which signal level has been converted by the dB, is decoded in a detector (DET) 63 in the following part.

Consequently, the signals swept by DET 63 during the sweeping interval represent the amplitudes of the time-series waveforms of the swept frequencies.

Therefore, the output signals from the detector 63 represent frequency spectrum waveforms, when plotted along with a horizontal axis of frequency and a vertical axis of amplitude.

The signals provided from the detector 63 that represent frequency spectrum waveforms are entered to an analog Video BAND Width (VBW) filter (not shown).

This VBW filter is comprised of a low pass filter (LPF) that removes high-frequency components (noise) in the frequency spectrum waveforms to be shown in a display unit 64 that is installed on the front panel of the apparatus.

A peak detector (not shown) detects the peak of the analog frequency spectrum waveform provided from the VBW filter at each position on the time axis and the final frequency spectrum waveform is obtained that is envelope-detected.

Signals presenting the final frequency spectrum waveforms are converted into digital data in an A/D converter 65 that is installed in the following part.

These frequency spectrum waveforms converted into digital data are displayed on the screen of the display unit 64 mounted on the front panel.

Changing the display frequency range on the display unit 64 and sweeping frequency range, frequency spectra over a wide range of frequency and in an arbitrary frequency range can be provided for measurement.

Further, if the bandwidth (RBW) of the RBW filter 61 is changed, the frequency resolution of the signal analyzing apparatus 51 can be changed.

In general, a wider sweeping range leads to a wider bandwidth (RBW) and a lower wavenumber resolution.

Namely, the bandwidth (RBW) of the RBW filter 61 depends on changes in the sweeping frequency range.

For higher productivity in signal measurement, the throughput of tuning and inspection in such signal analyzing apparatuses should be raised.

One of the improvements is to reduce measurement time and another is to raise the sweeping seed.

In signal analyzing apparatuses such as conventional spectrum analyzers, since the minimum sweeping time is around 20 ms, the magnitude of delay is not important.

Signal analyzing apparatuses such as modern spectrum analyzers conduct high speed sweeping by raising the sweeping rate in the local oscillator.

However, in the prior-art signal analyzers shown in FIG. 3, a high-speed sweeping causes a delay in the response of signals upon data sampling in the A/D converter 65 because of a group delay time that is induced in devices ranging from the signal mixer 58 to the A/D converter 65 to which local oscillation signals are entered.

In particular, in the case of a high-speed sweeping conducted in the configuration of FIG. 3, delay occurs on the way to the A/D converter 65 due to the delay characteristics of the analog RBW filter 61, and such delay increases if RBW (bandwidth) of the RBW filter 61 becomes narrow.

Such time delays appear as shifts in the frequency position when waveforms are shown in the display unit 64.

Namely, as demonstrated in FIG. 5, the peak position that should be located at the central frequency fc shown by the solid line moves to a position, fc', shown by the dotted line, causing an error display of frequency. Correct signal analysis thus becomes difficult to perform.

BRIEF SUMMARY OF THE INVENTION

This invention has been made to solve the above problems, and the object of the invention is, in particular, to provide a signal analyzing apparatus that can perform precise signal analysis by reducing frequency errors induced in high-speed sweeping.

To achieve the above object, according to the first aspect of the present invention, there is provided a signal analyzing apparatus comprising:

a frequency conversion unit (4) that converts input signals into those of intermediate-frequencies using a predetermined local oscillation frequency;

a sweeping unit (12) that sweeps the local oscillation frequency in a predetermined sweeping time;

a filter (10) that receives signals output from the frequency conversion unit and selectively passes signals having frequency components of a predetermined bandwidth;

an A/D conversion unit (16) that samples the signals that have passed the filter and converts them into predetermined digital data;

a data storage unit (17) that saves the digital data converted by the A/D conversion unit;

a signal processing unit (18) that conducts signal processing, extending the digital data saved in the data storage unit into frequency spectrum data;

a correction data storage unit (20) that saves correction data representing delay times for the bandwidth of the filter;

a control unit (11) that causes the signal processing unit to process signals so that a measured frequency corresponding to the local oscillation frequency for starting sweep in the sweeping unit and the digital data corresponding to the measured frequency saved in the data storage unit may be processed in a one-to-one relationship in the signal processing unit by changing the timing at which data is sent from the A/D conversion unit to the signal processing unit via the data storage unit based on the correction data saved in the correction data storage unit; and an output unit (19) that outputs the frequency spectrum data which has been processed in the signal processing unit.

Also to achieve the above object, according to the second aspect of the present invention, there is provided a signal analyzing apparatus comprising:

a frequency conversion unit that converts the frequencies of input signals into intermediate-frequencies;

a sweeping unit that sweeps the frequencies of the intermediate-frequency signals that are outputted by changing local oscillation frequencies in the frequency conversion unit, for a predetermined sweeping time;

a filter that receives the intermediate-frequency signals output from the frequency conversion unit and selectively passes the frequency components of a predetermined bandwidth;

an A/D conversion unit that converts the signals that have passed the filter into digital data with number of points based on a predetermined sampling frequency;

a data storage unit that saves the digital data converted by the A/D conversion unit;

a signal processing unit that conducts signal processing, extending the digital data saved in the data storage unit into frequency spectrum waveforms;

a display unit that displays the frequency spectrum waveforms processed in the signal processing unit; and a control unit that causes the data storage unit to save a plurality of sets of digital data converted by the A/D conversion unit, more than number of display data points displayed in the display unit, in the data storage unit, and enter a readout initiation position in the data storage unit to the signal processing unit with a correction of number of points corresponding to delay times due to the filter.

Also to achieve the above object, according to the third aspect of the present invention, there is provided a signal analyzing apparatus comprising:

a frequency conversion unit that converts the frequencies of input signals into intermediate-frequencies;

a sweeping unit that sweeps the frequencies of the intermediate-frequency signals that are outputted by changing local oscillation frequencies in the frequency conversion unit, for a predetermined sweeping time;

a filter that receives the intermediate-frequency signals output from the frequency conversion unit and selectively passes signals having frequency components of a predetermined bandwidth;

an A/D conversion unit that converts the signals that have passed the filter into digital data;

a data storage unit that saves the digital data converted by the A/D conversion unit;

a signal processing unit that conducts signal processing, extending the digital data saved in the data storage unit into frequency spectrum waveforms;

a display unit that displays the frequency spectrum waveforms processed by the signal processing unit; and a control unit that delays data acquisition timing in the data storage unit as long as delay time induced in the filter.

Also to achieve the above object, according to the forth aspect of the present invention, there is provided a signal analyzing apparatus comprising:

a frequency conversion unit that converts frequencies of input signals into intermediate-frequencies;

a sweeping unit that sweeps frequencies of intermediate-frequency signals that are outputted by changing local oscillation frequencies in the frequency conversion unit, for a predetermined sweeping time;

a filter that receives the intermediate-frequency signals output from the frequency conversion unit and selectively passes signals having the frequency components of a predetermined bandwidth;

an A/D conversion unit that converts the signals that have passed the filter into digital data;

a data storage unit that saves the digital data converted by the A/D conversion unit;

a signal processing unit that conducts signal processing, extending the digital data saved in the data storage unit into frequency spectrum waveforms;

a display unit that displays the frequency spectrum waveforms processed in the signal processing unit;

a correction data storage unit that saves the data indicating delay times due to the filter; and a control unit that calculates delay times of signal till through the A/D converter, based on sweeping time for one point in sampling by the A/D converter and the correction data saved in the correction data storage unit, further calculates readout initiation position in the data storage unit from this calculated delay time, and enters the calculation results into the signal processing unit;

wherein the signal processing unit reads out digital data sequentially starting from the readout initiation position calculated by the control unit and outputs the digital data, extending into frequency spectrum waveforms after signal processing.

Further to achieve the above object, according to the fifth aspect of the present invention, there is provided a signal analyzing apparatus comprising:

a frequency conversion unit that converts the frequencies of input signals into intermediate-frequencies;

a sweeping unit that sweeps frequencies of the intermediate-frequency signals that are outputted by changing local oscillation frequency in the frequency conversion unit, for a predetermined sweeping time;

a filter that receives the intermediate-frequency output signals from the frequency conversion unit and selectively passes signal having frequency components of a predetermined bandwidth;

an A/D conversion unit that converts the signals that have passed the filter into digital data;

a data storage unit that saves the digital data converted by the A/D conversion unit;

a signal processing unit that conducts signal processing, extending the digital data saved in the data storage unit into frequency spectrum waveforms;

a display unit that displays the frequency spectrum waveforms processed in the signal processing unit;

a correction data storage unit that saves the data indicating delay times due to the filter;

a delay circuit inserted for use in the input of timing for data acquisition in the data storage unit; and a control unit that calculates delay times for the bandwidth of the filter saved in the correction data storage unit and controls delay times of the delay circuit so that it matches the calculated delay time;

wherein the timing for data acquisition from the data storage unit is delayed as long as the delay time in the delay circuit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
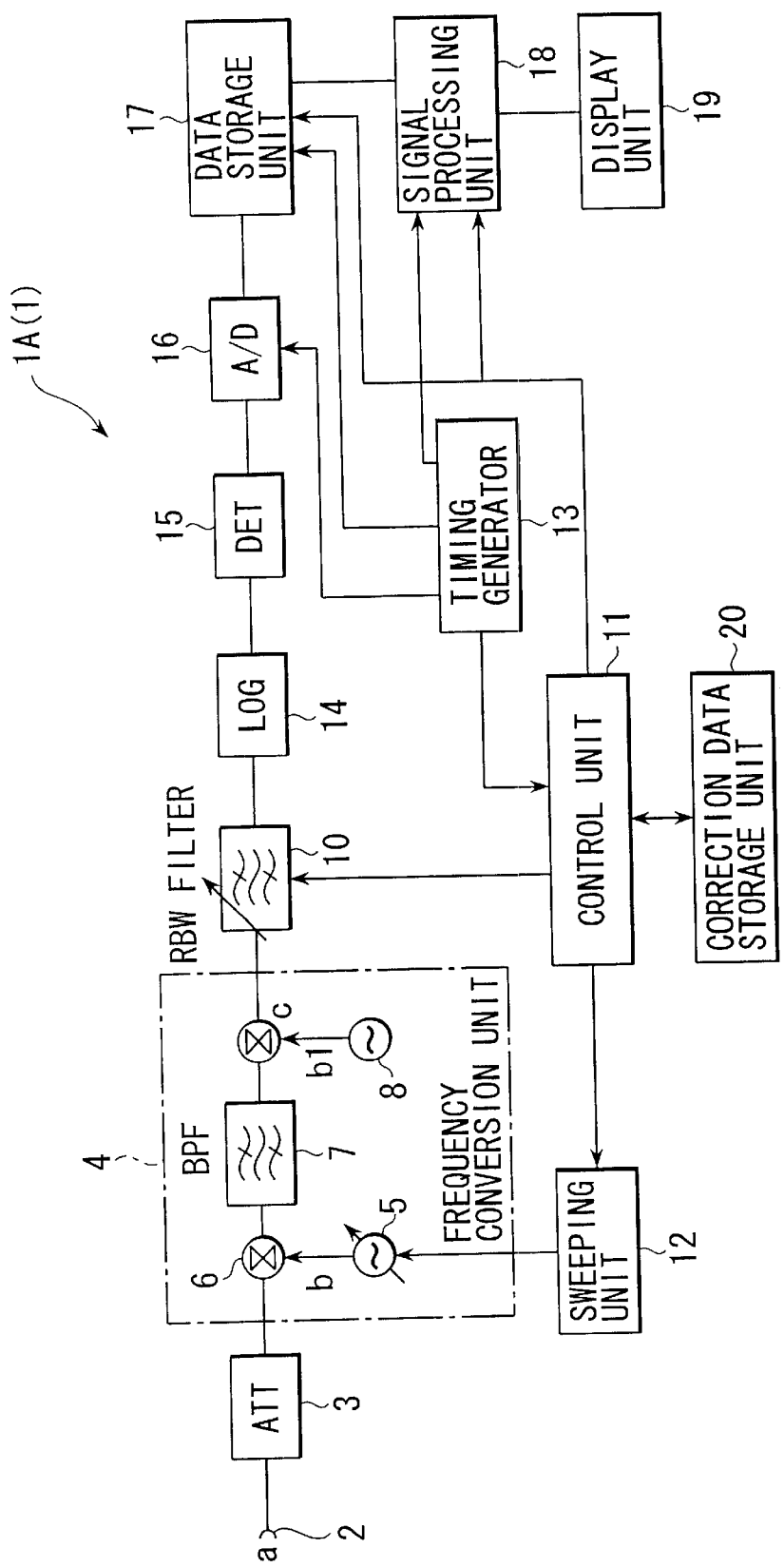
FIG. 1 is a block diagram illustrating the configuration of a signal analyzing apparatus according to a first embodiment of the present invention.

Reference will now be made in detail to the presently preferred embodiments of the invention as illustrated in the accompanying drawings, in which like reference numerals designate like or corresponding parts.

First Embodiment

FIG. 1 is a block diagram illustrating the configuration of a signal analyzing apparatus 1A (1) according to the first embodiment of the present invention.

The configuration of the signal analyzing apparatus 1A according to the first embodiment of the invention will be described along with its signal processing procedures.

A high-frequency signal "a" of several hundred KHz to several GHz for example, which will be decoded, coming in from an input terminal 2, enters a frequency conversion unit 4 after its signal intensity has been adjusted to a predetermined level by an attenuator (ATT) 2.

This frequency conversion unit 4 comprises a first local oscillator 5, a first signal mixer 6, a BPF (Band Pass Filter) 7, a second local oscillator 8 and a second signal mixer 9.

This frequency conversion unit 4 synthesizes the high-frequency signal "a" entered from the attenuator 2 with the local oscillation signal "b" sent from the local oscillator 5 in the first signal mixer 6 to convert them into an intermediate-frequency signal.

The intermediate-frequency signal sent from said frequency conversion unit 4 is narrowed in bandwidth in BPF7 and again synthesized with the local oscillation signal "b1" sent from the second oscillator 8 in the second signal mixer 9. Then it enters the RBW filter 10 as the final intermediate-frequency signal "c".

The frequency conversion of the intermediate-frequency signal "a" for decoding is conducted by the frequency converter 4 as follows.

When the user sets a sweeping interval, a control unit 11 enters control signals indicating a corresponding sweep time to a sweeping unit 12.

The sweeping unit 12 thereby selectively controls the oscillation frequency of the first local oscillator 5 and sweeps the signals in the sweeping time determined by the user over the sweeping frequency range.

As a result, the frequency of the intermediate-frequency signal "c" sent from the frequency converter 4 changes in synchronization with this sweeping operation.

A timing generator 13 creates timing signals that match the operational frequency of each unit by dividing and distributing the base clock signal.

These timing signals are phase-synchronized with each other and sent to the control unit 11, A/D converter 16, data storage unit 17 and signal processing unit 18.

Figures 3, 6:
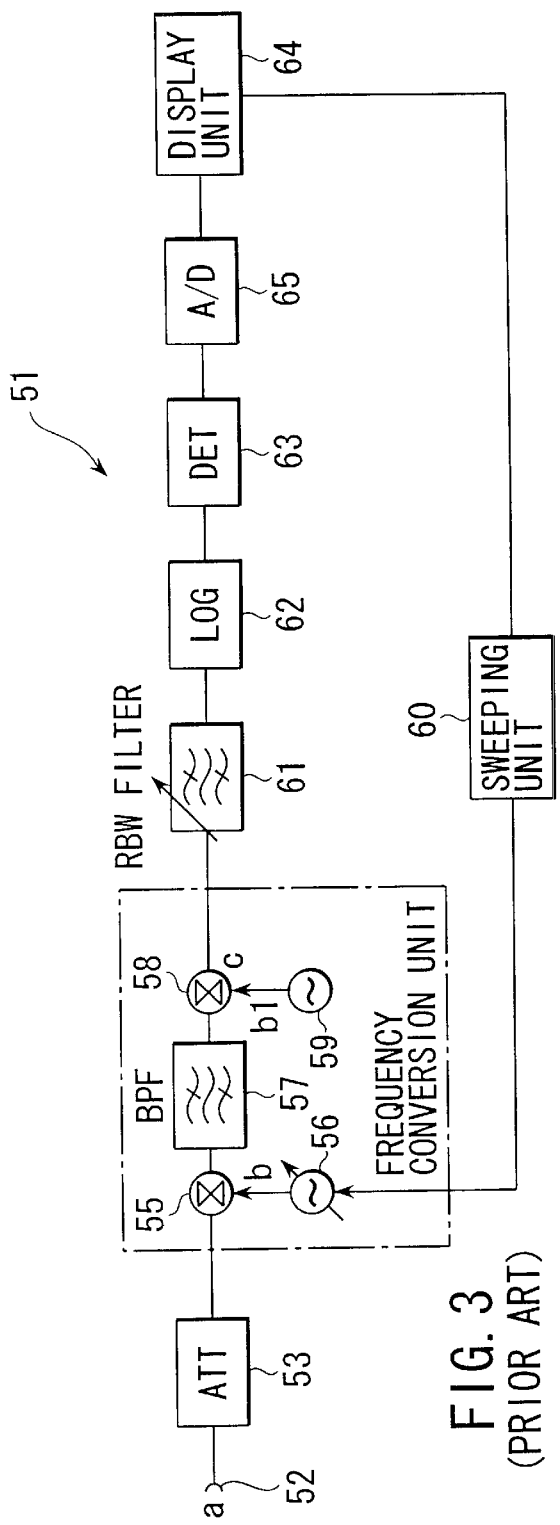
FIG. 3 is a block diagram illustrating the schematic configuration of a prior-art signal analyzing apparatus.
FIG. 6 is a table of correction data showing the delay for each RBW of the RBW filter, which is saved in tabular form in the correction data storage device employed in the signal analyzing apparatus according to the second embodiment of the invention.
Figure 4:
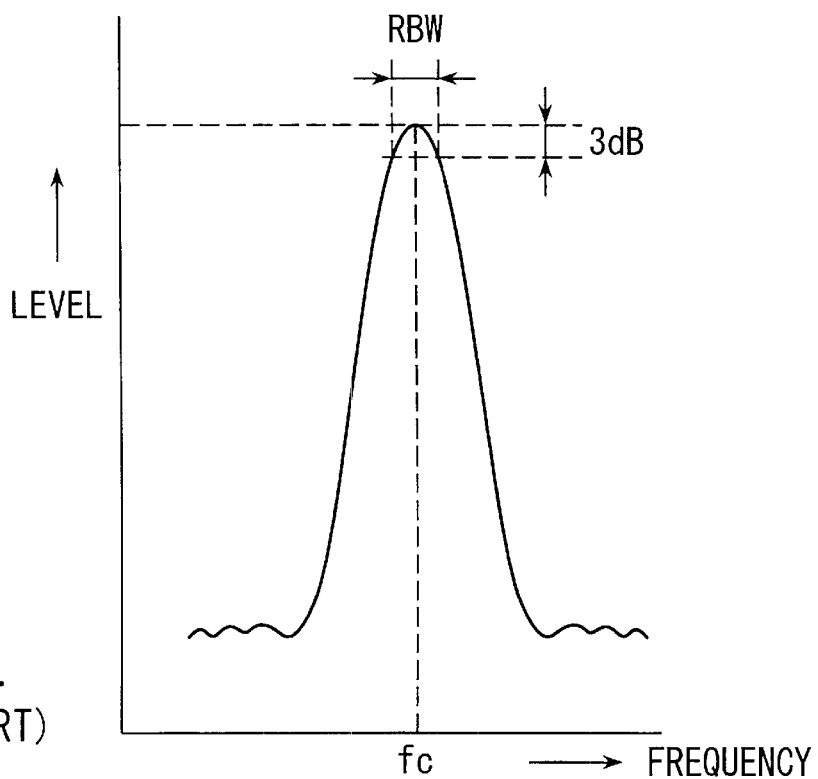
FIG. 4 is the frequency characteristics of a common RBW filter.

The above RBW filter 10 is comprised of, for example, a band pass filter having frequency characteristics shown in FIG. 3. Its bandwidth (RBW) is variable and set through the control unit 11.

This RBW filter 10 removes unnecessary frequency components from the intermediate-frequency signal "c" sent from the frequency conversion unit 4 and only passes intermediate-frequency signals in the frequency components of a bandwidth variably set by the control unit 11.

These intermediate-frequency signals are adjusted in gain by an amplifier (not shown) and then entered to the LOG conversion unit 14.

The LOG conversion unit 14 converts the levels of intermediate-frequency signals entered through an amplifier (not shown) from the RBW filter 10 by the dB unit.

The intermediate-frequency signals of which levels have been converted into dB units by the LOG conversion unit 14 are decoded by the detection unit 15 in the following part.

As a result, the signals detected during the sweeping interval represent the amplitude of the time-series waveforms of swept frequencies, providing frequency spectrum waveforms when plotted along with frequency on a horizontal axis and amplitude on a vertical axis.

The signals representing frequency spectrum waveforms decoded by the detection unit 15 are converted into digital data by the A/D converter 16, by the use of sampling signals sent from the timing generator 13 (for example, sampling frequency is 200 ksps).

The minimum sampling frequency in the A/D converter 16 is determined by the number of sampling points and sweeping time.

For example, if there are 500 sampling points and the sweeping time is 5 ms, the minimum sampling frequency becomes 100 ksps.

The digital data representing frequency spectrum waveforms converted by the A/D converter 16 is saved in the data storage unit 17 with the timing provided by the timing signal sent from the timing generator 13 which is controlled by the control unit 11.

In the data storage unit 17, the digital data sets of a data point number (for example, 500+α) which is larger than that of the points (for example, 500) of display data to be plotted along the horizontal axis (time axis) on the screen of the display unit 19 are each saved sequentially in the areas of each address in the data storage unit 17.

In order to sample data points more than the display data points (for example, 500), it may be possible to raise the sampling frequency and take data points a few times as many as the display data points (for example 1000+β, if it is twice the display points; data display is made at intervals of every two points).

During readout of digital data saved in the data storage unit 17, the control unit 11 calculates the delay time induced in the processing through the A/D converter 16, based on the sweeping time for each point caused by sampling by the A/D converter 16 and the correction data saved in the correction data storage unit 20.

Further, based on the above delay time, the control unit 11 calculates the readout initiation position (readout initiation address) in the data storage unit 17, and provide a signal processing unit 18 with the calculation results.

This signal processing unit 18 begins reading digital data at the readout initiation position in the data storage unit 17, which has been calculated by the control unit 11, at the timing provided the timing generator 13.

Further, this signal processing unit 18 conducts a signal processing of the readout digital data and shows waveforms on the screen of the display unit 19, extending the digital data into frequency spectrum waveforms.

Figure 5:
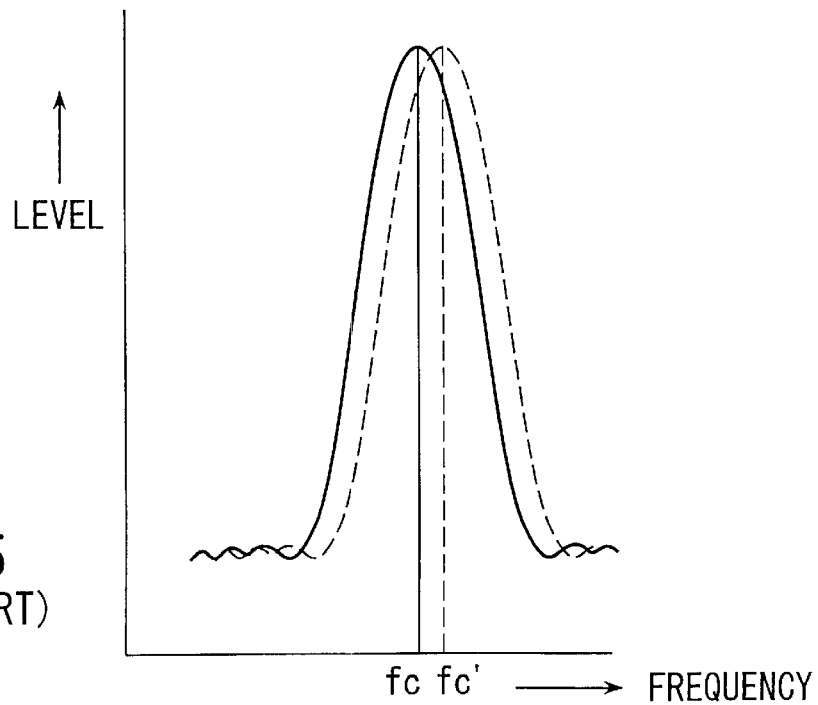
FIG. 5 is a diagram illustrating the display frequency error caused in the prior-art signal analyzing apparatus.

In the correction data storage unit 20, as shown in the table of FIG. 5, the data indicating the delay time for each RBW in the RBW filter 10 variably set by the user is saved in tabular form as correction data.

During high-speed sweeping in the signal analyzing apparatus 1A according to the first embodiment, of digital data which is processed by intermediate frequencies and converted by the A/D converter 16, the data sets of more than the display data points to be shown in the display unit 19 are sampled by the control unit 11 and saved in the data storage unit 17, and the readout initiation position in the data storage unit 17 is calculated from the determined sweeping time and the correction data saved in the data storage unit 20.

In the signal analyzing apparatus 1A according to the first embodiment of the invention, the signal processing unit 18 sequentially reads digital data saved in the data storage unit 17, starting off from the readout initiation position calculated by the control unit 11, and displays the effective display data on the screen of the display unit 19 in a form of frequency spectra, with the display data being shifted as long as the known delay time induced in the RBW filter 10.

As a result, in the signal analyzing apparatus 1A according to the first embodiment of the invention, the display frequency errors caused by the delay time in the RBW filter 10 are corrected, and thereby frequency spectrum waveforms more precise than the prior ones can be displayed.

In other words, in the signal analyzing apparatus 1A according to the first embodiment of the invention, as shown in FIG. 5, frequency spectrum waveforms can be displayed, with the right peak position that should exist at the original central frequency fc as shown by the solid line in the figure being located at fc, without a shift to fc' shown by the dotted line in the figure like the case in the conventional signal analyzing apparatus.

Further, in the signal analyzing apparatus 1A according to the first embodiment of the invention, regardless of the number of data points displayed in the display unit 19, the digital data converted by the A/D converter 16 can be sequentially saved in the data storage unit 17.

Second Embodiment

Figure 2:
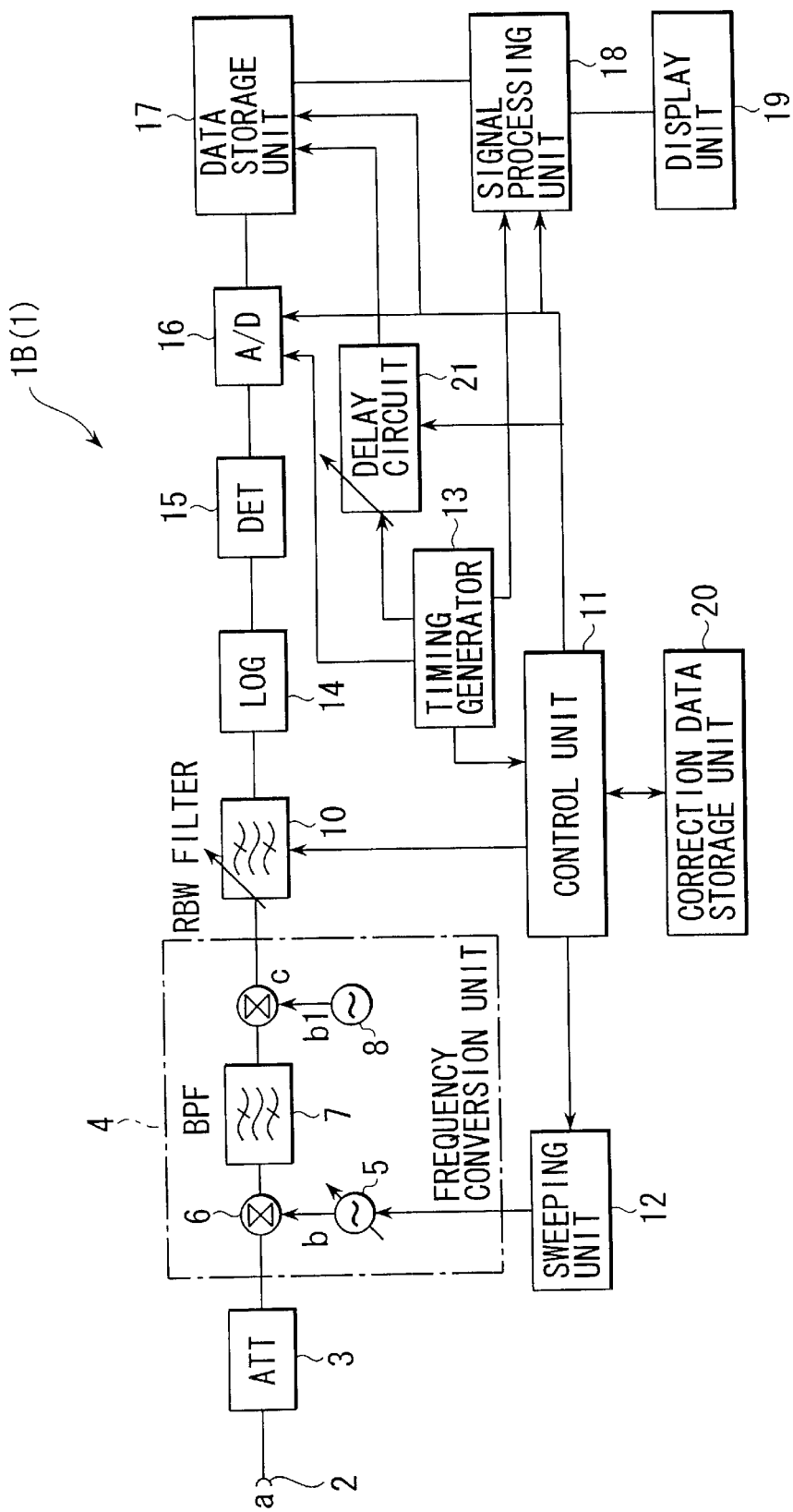
FIG. 2 is a block diagram illustrating the configuration of a signal analyzing apparatus according to a second embodiment of the present invention.

FIG. 2 is a block diagram illustrating the configuration of a signal analyzing apparatus according to a second embodiment of the present invention.

In FIGS. 1 and 2, like components have like numbers and the explanations of like components are not repeated.

The signal analyzing apparatus 1B (1) according to the second embodiment of the invention has a delay circuit 21 that can change delay time induced between the timing generator 13 and the data storage unit 17.

The data storage unit 17 has a storage capacity where the digital data of data points (for example, 500) displayed on the screen of the display unit 19 can be saved.

In the signal analyzing apparatus 1B according to the second embodiment of the invention, the signal processing from the input of input signal "a" to the input terminal 2 through the A/D converter 16 is the same as that in the signal analyzing apparatus 1A, but the signal processing after that will be different.

Namely, the data sets converted to digital data by the A/D converter 16 are sequentially saved one by one in each address of the data storage unit 17.

At that time, the data storage unit 17 saves the digital data sets as many as the display data points (for example, 500).

When digital data is saved in the data storage unit 17, the control unit 11 calculates the currently set delay time for the RBW (bandwidth) of the RBW filter 10 and selectively controls the delay time in the delay circuit 21 to match the calculated delay time.

In this case, as the delay time for RBW of said RBW filter 10, a corresponding delay time among the delay time data saved in tabular form in the correction data storage unit 20, as shown in FIG. 6, is selectively read out and adopted.

The timing signal entered from the timing generator 13 to the data storage unit 17 is thereby delayed as much as the delay time calculated in the control unit 11.

Thus, digital data sets are sequentially written in the data storage unit 17 based on the timing signals that have been delayed as long as the above delay time.

The digital data written in the data storage unit 17 is read out under control of the control unit 11 and processed in the signal processing unit 18. Then, the digital data is extended into frequency spectrum waveforms to be displayed on the screen of the display unit 19.

In the signal analyzing apparatus 1B according to the second embodiment of the invention, the delay circuit 21 is inserted in the apparatus and the timing of data acquisition from the data storage unit 17 is delayed as long as the delay time induced in the RBW filter 10.

As a result, since the display frequency errors due to delay in the RBW filter 10 can be corrected, if the above configuration where the delay circuit 21 is inserted in the conventional configuration for the signal analyzing apparatus is employed, the frequency spectrum waveforms can be analyzed more precisely than those by the prior-art signal analyzing apparatus.

Further, since the data storage unit 17 saves digital data sets as many as the display data points, the storage capacity of the data storage unit 17 can be minimized.

As mentioned before, during high-speed sweeping in the prior-art signal analyzing apparatus demonstrated in FIG. 3, the delay caused in the processing through the A/D converter appears on the screen of the display unit as a form of frequency error.

In contrast, in the signal analyzing apparatuses 1A and 1B according to the embodiments of the present invention shown in FIGS. 1 and 2, particularly during high-speed sweeping, the display frequency error due to such delay can be reduced to a degree of one data point sampled by the A/D converter 16.

Note that the display frequency errors, particularly, caused by delay in the RBW filter 10 are corrected by the configurations of FIGS. 1 and 2 according to the embodiments of the invention.

However, in the present invention, the signal analyzing apparatus may be configured to correct display frequency errors due to not only the delay in the RBW filter 10 but also the delay in the analog filter installed before the A/D converter.

For example, in the preferred embodiments of the invention shown in FIGS. 1 and 2, another configuration can be employed that corrects the display frequency errors including those due to the VBW filter (not shown).

In this case, the data of delay time corresponding to the bandwidth in the RBW filter 10 and VBW filter is saved in tabular form in the correction data storage unit 20.

The VBW filter (not shown) is inserted between the detector 15 and the A/D converter 16 in the configurations of FIGS. 1 and 2, comprised of an LPF (low pass filter) that removes high-frequency components (noise components) in the frequency spectrum waveforms which will be finally shown on the display unit 19. The signals representing the frequency spectrum waveforms sent from the detector 15 are entered to this VBW filter.

For the analog frequency spectrum waveforms outputted from the VBW filter, each peak position along the time axis is detected by a peak detector (not shown) and the final frequency spectrum waveforms can be obtained that have gone through envelope detection.

The signals representing the final frequency spectrum waveforms are converted to digital data by a following A/D converter 16.

As evident in the above description, in the signal analyzing apparatus according to the present invention, the display frequency errors due to delay in the filters installed before the A/D converter during high-speed sweeping can be reduced and waveform analysis can be performed more precisely than in the prior-art signal analyzing apparatus.

In particular, in the signal analyzing apparatuses according to the first, second and forth embodiments of the present invention, regardless of the number of display data points to be shown in the display unit, the digital data sets converted by the A/D converter can be sequentially saved in the data storage unit.

The configurations according to the third and fifth embodiments of the invention can be adopted to the prior-art signal analyzing apparatus with no modification. Further, since the digital data sets as many as the display data points are saved in the data storage unit, the data storage capacity can be minimized.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A signal analyzing apparatus comprising:

a frequency conversion unit that converts input signals into those of intermediate-frequencies using a predetermined local oscillation frequency;

a sweeping unit that sweeps said local oscillation frequency over a sweeping frequency range in a predetermined sweeping time;

a filter that receives signals output from said frequency conversion unit and selectively passes signals having frequency components of a predetermined bandwidth;

an A/D conversion unit that samples the signals that have passed said filter and converts them into predetermined digital data;

a data storage unit that saves the digital data converted by the A/D conversion unit;

a signal processing unit that conducts signal processing, extending the digital data saved in said data storage unit into frequency spectrum data;

a correction data storage unit that saves correction data representing delay times for the bandwidth of said filter;

a control unit that causes the signal processing unit to process signals so that a measured frequency corresponding to the local oscillation frequency for starting sweep in said sweeping unit and the digital data corresponding to said measured frequency saved in said data storage unit may be processed in a one-to-one relationship in said signal processing unit by changing the timing at which data is sent from said A/D conversion unit to said signal processing unit via said data storage unit based on the correction data saved in the correction data storage unit; and an output unit that outputs the frequency spectrum data which has been processed in the signal processing unit.

2. The signal analyzing apparatus according to claim 1, wherein said filter includes a Resolution BAND Width filter.

3. The signal analyzing apparatus according to claim 1, wherein said output unit includes a display unit that displays said frequency spectrum data sent from said signal processing unit in frequency spectrum waveforms on the screen with a horizontal axis of frequency and a vertical axis of amplitude.

4. The signal analyzing apparatus according to claim 1, wherein said control to process the measured frequency corresponding to the local oscillation frequency for starting sweeping in said sweeping unit and the data corresponding to said measured frequency saved in said storage unit in a one-to-one relationship in said signal processing unit implies the control including a control that saves a plurality of sets of digital data converted by said A/D conversion unit, more than the number of the display data points displayed in said display unit, in said data storage unit, and enters the readout initiation position in said data storage unit to said signal processing unit with a correction of the number of points corresponding to the delay in said filter.

5. The signal analyzing apparatus according to claim 1, wherein said control to process the measured frequency corresponding to the local oscillation frequency for starting sweeping in said sweeping unit and the data corresponding to said measured frequency saved in said storage unit in a one-to-one relationship in said signal processing unit implies the control including a control that delays the data acquisition timing in said data storage unit as long as the delay induced in said filter.

6. The signal analyzing apparatus according to claim 1, wherein:

said control to process the measured frequency corresponding to the local oscillation frequency for starting sweeping in said sweeping unit and the data corresponding to said measured frequency saved in said storage unit in a one-to-one relationship in said signal processing unit implies the control including a control that calculates the signal delay time through said A/D converter, based on the sweeping time for one point in sampling by said A/D converter and the correction data saved in said correction data storage unit, further calculates the readout initiation position in said data storage unit from this calculated delay time, and enters the calculation results into said signal processing unit; and said signal processing unit reads out digital data sequentially starting from the readout initiation position calculated by said control unit and outputs the digital data, extending into frequency spectrum waveforms after signal processing.

7. The signal analyzing apparatus according to claim 1, further comprising:

a correction data storage unit where the delay time for the bandwidth of said filter is saved; and a delay circuit inserted for use in the input of timing for data acquisition in said data storage;

wherein said control to process the measured frequency corresponding to the local oscillation frequency for starting sweeping in said sweeping unit and the data corresponding to said measured frequency saved in said storage unit in a one-to-one relationship in said signal processing unit implies the control including a control that calculates the delay time for the bandwidth of said filter saved in said correction data storage unit and controls the delay time in said delay circuit so that it matches the calculated delay time; and the timing for data acquisition from said data storage unit is delayed as long as the delay time in said delay circuit.

8. A signal analyzing apparatus comprising:

a frequency conversion unit that converts the frequencies of input signals into intermediate-frequencies;

a sweeping unit that sweeps the frequencies of said intermediate-frequency signals that are outputted by changing local oscillation frequencies in said frequency conversion unit, for a predetermined sweeping time;

a filter that receives the intermediate-frequency signals output from said frequency conversion unit and selectively passes the frequency components of a predetermined bandwidth;

an A/D conversion unit that converts the signals that have passed said filter into digital data with number of points based on a predetermined sampling frequency;

a data storage unit that saves the digital data converted by said A/D conversion unit;

a signal processing unit that conducts signal processing, extending the digital data saved in said data storage unit into frequency spectrum waveforms;

a display unit that displays the frequency spectrum waveforms processed in said signal processing unit; and a control unit that causes the data storage unit to save a plurality of sets of digital data converted by said A/D conversion unit, more than number of display data points displayed in said display unit, in said data storage unit, and enter a readout initiation position in said data storage unit to said signal processing unit with a correction of number of points corresponding to delay times due to said filter.

9. A signal analyzing apparatus comprising:

a frequency conversion unit that converts the frequencies of input signals into intermediate-frequencies;

a sweeping unit that sweeps the frequencies of said intermediate-frequency signals that are outputted by changing local oscillation frequencies in said frequency conversion unit, for a predetermined sweeping time;

a filter that receives the intermediate-frequency signals output from said frequency conversion unit and selectively passes signals having frequency components of a predetermined bandwidth;

an A/D conversion unit that converts the signals that have passed said filter into digital data;

a data storage unit that saves the digital data converted by said A/D conversion unit;

a signal processing unit that conducts signal processing, extending the digital data saved in said data storage unit into frequency spectrum waveforms;

a display unit that displays the frequency spectrum waveforms processed by said signal processing unit; and a control unit that delays data acquisition timing in said data storage unit as long as delay time induced in the filter.

10. A signal analyzing apparatus comprising:

a frequency conversion unit that converts frequencies of input signals into intermediate-frequencies;

a sweeping unit that sweeps frequencies of intermediate-frequency signals that are outputted by changing local oscillation frequencies in said frequency conversion unit, for a predetermined sweeping time;

a filter that receives the intermediate-frequency signals output from said frequency conversion unit and selectively passes signals having the frequency components of a predetermined bandwidth;

an A/D conversion unit that converts the signals that have passed said filter into digital data;

a data storage unit that saves the digital data converted by said A/D conversion unit;

a signal processing unit that conducts signal processing, extending the digital data saved in said data storage unit into frequency spectrum waveforms;

a display unit that displays the frequency spectrum waveforms processed in said signal processing unit;

a correction data storage unit that saves the data indicating delay times due to said filter; and a control unit that calculates delay times of signal till through said A/D converter, based on sweeping time for one point in sampling by said A/D converter and the correction data saved in said correction data storage unit, further calculates readout initiation position in said data storage unit from this calculated delay time, and enters the calculation results into said signal processing unit;

wherein said signal processing unit reads out digital data sequentially starting from the readout initiation position calculated by said control unit and outputs the digital data, extending into frequency spectrum waveforms after signal processing.

11. A signal analyzing apparatus comprising:

a frequency conversion unit that converts the frequencies of input signals into intermediate-frequencies;

a sweeping unit that sweeps frequencies of said intermediate-frequency signals that are outputted by changing local oscillation frequency in said frequency conversion unit, for a predetermined sweeping time;

a filter that receives the intermediate-frequency output signals from said frequency conversion unit and selectively passes signal having frequency components of a predetermined bandwidth;

an A/D conversion unit that converts the signals that have passed said filter into digital data;

a data storage unit that saves the digital data converted by said A/D conversion unit;

a signal processing unit that conducts signal processing, extending the digital data saved in said data storage unit into frequency spectrum waveforms;

a display unit that displays the frequency spectrum waveforms processed in said signal processing unit;

a correction data storage unit that saves the data indicating delay times due to said filter;

a delay circuit inserted for use in the input of timing for data acquisition in said data storage unit; and a control unit that calculates delay times for the bandwidth of said filter saved in said correction data storage unit and controls delay times of said delay circuit so that it matches the calculated delay time;

wherein the timing for data acquisition from said data storage unit is delayed as long as the delay time in said delay circuit.

* * * * *